INVENTORS:
ROBERT L. DAVIES,
GERALD C. HUTH,
BY Urban H. Faubion
THEIR ATTORNEY.

INVENTORS:
ROBERT L. DAVIES,
GERALD C. HUTH,
BY [signature]
THEIR ATTORNEY.

INVENTORS:
ROBERT L. DAVIES,
GERALD C. HUTH,
BY Urban H. Faubion
THEIR ATTORNEY.

INVENTORS:
ROBERT L. DAVIES,
GERALD C. HUTH,
BY Urban L. Faubion
THEIR ATTORNEY.

Jan. 20, 1970 G. C. HUTH ET AL 3,491,272

SEMICONDUCTOR DEVICES WITH INCREASED VOLTAGE BREAKDOWN CHARACTERISTICS

Filed Jan. 30, 1963 7 Sheets-Sheet 5

INVENTORS:
ROBERT L. DAVIES,
GERALD C. HUTH,

BY Urban H. Faubion

THEIR ATTORNEY.

INVENTORS:
ROBERT L. DAVIES,
GERALD C. HUTH,
BY Urban H. Faubion
THEIR ATTORNEY.

INVENTORS:
ROBERT L. DAVIES,
GERALD C. HUTH,
BY [signature]
THEIR ATTORNEY.

3,491,272

SEMICONDUCTOR DEVICES WITH INCREASED VOLTAGE BREAKDOWN CHARACTERISTICS

Gerald C. Huth, Malvern, Pa., and Robert L. Davies, Auburn, N.Y., assignors to General Electric Company, a corporation of New York Filed Jan. 30, 1963, Ser. No. 255,037
Int. Cl. H01l 3/00, 5/00
U.S. Cl. 317—234 5 Claims

ABSTRACT OF THE DISCLOSURE

To improve the reverse voltage breakdown characteristics of a semiconductor body having a junction therein formed by zones of dissimilar resistivities the periphery of the body adjacent the junction is beveled. With a positive bevel (lowest cross-section zone having the highest resistivity) the reverse voltage breakdown characteristics improve progressively as the angle between the junction and the beveled periphery decreases. With a negative bevel (highest cross-section zone having the highest resistivity) the reverse voltage breakdown characteristics are typically optimal in the range of from four to nine degrees. With a dielectric coating on the beveled periphery the angle range may be extended to from one to twenty-five degrees. With two junction bodies having a higher resistivity N or P central zone between P or N zones, respectively, of lower resistivity a positive bevel may be provided at each junction so that a pulley-like concave periphery results with the minimum cross-section of the body appearing in the central zone, or a combination of positive and negative bevels may be employed in such two junction devices with like or dissimilar bevel angles at each junction. With a body having low resistivity zones of dissimilar conductivity type separated by a zone of higher resistivity forming junctures therewith beveling improves reverse breakdown voltage characteristics at angles below ninety degrees and above twelve degrees.

This invention relates to a means for improving the characteristics of semiconductor materials which have at least one internal junction between two zones of different conduction characteristics and the characteristics of devices which utilize such materials. More specifically, the invention is directed toward means for increasing the reverse or inverse voltage which may be applied to such devices without a breakdown and to increase the ability of such devices to dissipate power when the device does break down in the reverse direction. Reverse or inverse voltage as used here is a voltage which is of a polarity that would normally cause conduction to take place across a given junction in the direction of high impedance.

A junction between zones of a semiconductor material having opposite type conduction characteristics provides a low resistance path to an electric current flowing across the junction in one direction, and a high resistance path to current flow in the opposite direction. A voltage which is of such a polarity as to force a current across the junction in the direction of higher resistance is the inverse voltage referred to above. When an inverse voltage is applied across the junction between zones of semiconductor material having an excess of free electrons (N type conduction characteristics) and an excess of positive holes (P or positive conduction characteristics) respectively, the region surrounding the junction becomes deficient of free electrons and positive holes (known as carriers). The reason that this happens is that when a positive voltage is applied at the negative type conduction zone and a negative voltage applied at the positive type conduction zone, the positive carriers are attracted to the negative voltage terminal and the negative carriers are attracted to the positive voltage terminal. Thus, the carriers on both sides of the junction are attracted away from the junction to form a region (called the depletion region). The depletion region is a dielectric because of the deficiency of carriers of either type.

The dielectric depletion region is highly resistive and is capable of withholding high voltages. For example, in most practical devices, the dielectric depletion region is capable of withstanding a reverse voltage of several hundred volts without breaking down through the bulk, i.e., interior of the material. However, most devices are not capable of withstanding more than a relatively small fraction of the voltage which the bulk will hold in the reverse direction (either transient or steady state) due to the fact that breakdown first occurs across or around the surface. For this reason, it is said that most such devices are surface limited.

The fact that most rectifiers are surface limited places severe limitations on the usefulness of the devices. To begin with, it means that the device cannot be used in circuits where reverse voltages (either steady state or transient) of over a few hundred volts are likely to occur without taking special precautions (frequently elaborate) to prevent application of the reverse voltage directly across the device.

As serious as this drawback appears, it is perhaps not as serious as other disadvantages which occur because such devices are surface limited; viz, device instability, and destruction of the device upon surface breakdown in the reverse direction.

Device instability is most frequently due to the fact that the condition of the semiconductor surface changes. The characteristics of such devices vary considerably with the condition of the surface. Therefore, unless some precautions are taken to assure that the surface condition will not change appreciably during the use of the device, the device stability is very poor. Actually it is much more difficult to control condition of the surface of the material than it is to control the characteristics of the bulk and it is certainly more difficult to control or prevent changes in surface condition than to control the essentially constant bulk characteristics. The fact of the matter is that even with elaborate precautions such as utilizing various kinds of surface treatment and placing the semiconductor material in an evacuated hermetically sealed container, the predominant failure mechanism of rectifier devices during operation is a result of surface degradation.

As to the point concerning device destruction, it is a well recognized fact that typical rectifiers (which are surface limited devices) may be permanently damaged or destroyed by only a few watts of power absorbed during breakdown, as from a very brief voltage transient, in the reverse or blocking direction. The fact that the bulk material can dissipate a great deal of energy is readily apparent by taking as an example a typical silicon rectifier and considering that such devices can, at least momentarily, dissipate 1,000 watts of heat in the forward direction of current flow without any damage whatsoever. This apparent anomaly can be explained by considering the fact that for conduction in the forward direction, current and its attendant heat losses spread out equally over the entire junction area, permitting maximum utilization of the entire rectifier cooling mechanism and its thermal capacity. However, in the reverse direction, the rectifier surface current under momentary high blocking voltage peaks finds some microscopic flaw or weakness at which to concentrate. Such weak spots usually occur at the junction surface where the rectifying junction emerges from the silicon pellet. At these minute spots, a fraction of a watt of concentrated heat may be sufficient to melt and destroy the blocking properties of the rectifier, regardless of size of the rectifier. The inverse voltage problem is so critical that transient rating in the reverse direction is done on the basis of voltage rather than energy.

When failure due to reverse voltage applied to the rectifier takes place through the bulk of the material instead of over the surface, the device can dissipate approximately as much energy, both steady state and transient, in its reverse direction as in its forward direction. When the device breaks down through the bulk and current flows in the reverse direction, the breakdown is called "avalanche breakdown" (sometimes mistakenly called "Zener breakdown"). Avalanche breakdown of a silicon rectifier diode is an inherent non-destructive characteristic that is widely used at relatively low power and voltage levels as a constant voltage reference and regulator in so called "Zener" diodes. Like a Zener diode, a rectifier operated within its thermal limitations maintains substantially constant voltage across it in the avalanche region of the voltage-current characteristic regardless of current in this region. As long as the current is limited by the external circuit to the thermal capability of the device, no damage results from true avalanche action. Hence, a device with uniform avalanche breakdown occurring at a voltage below that at which local dielectric surface breakdowns occur, can dissipate hundreds of times more reverse energy with transient over-voltage conditions than one where the converse is true.

Perhaps it is well to point out that breakdown is likely to occur at the surface of the semiconductor material because of the high voltage gradient at the surface of the device. Stated in another way, breakdown occurs at the surface due to high concentration of electric fields at the surface. As a practical matter, the place where the electric field is usually of the highest intensity is in the vicinity of the junction between the two zones of opposite conduction type characteristics. For example, the transition region or junction between the two different conduction zones may be on the order of $10^{-3}$ centimeters in thickness. Thus, it is readily seen that a very strong electric field (high electric field intensity) occurs at a surface area of the body intercepted by the junction.

With these facts in mind, the objects of the present invention can be fully appreciated. For example, it is an object of the present invention to provide a semiconductor device wherein breakdown due to reverse voltage occurs within the bulk of the material of the semiconductor material instead of at the surface. Another object of the invention is to provide a semiconductor device capable of wide application without the necessity of providing protective devices which prevent high reverse voltages. Still another object of the invention is to provide a semiconductor device with surface stability problems largely eliminated.

In carrying out the present invention, semiconductor material and the device in which it is used is made bulk limited rather than surface limited by effectively distributing the electric fields over the surface to lower the maximum value (i.e., the peak electric field is reduced) or the surface voltage gradient is reduced in the area of junction by carefully controlling the shape of the surface in the region of the junction.

The novel features which are believed to be characteristic of the invention are set forth with particularity in the appended claims. The invention itself, however, both as to its organization and method of operation together with further objects and advantages thereof may best be understood by reference to the following description taken in connection with the accompanying drawings in which:

Figures 6, 7:
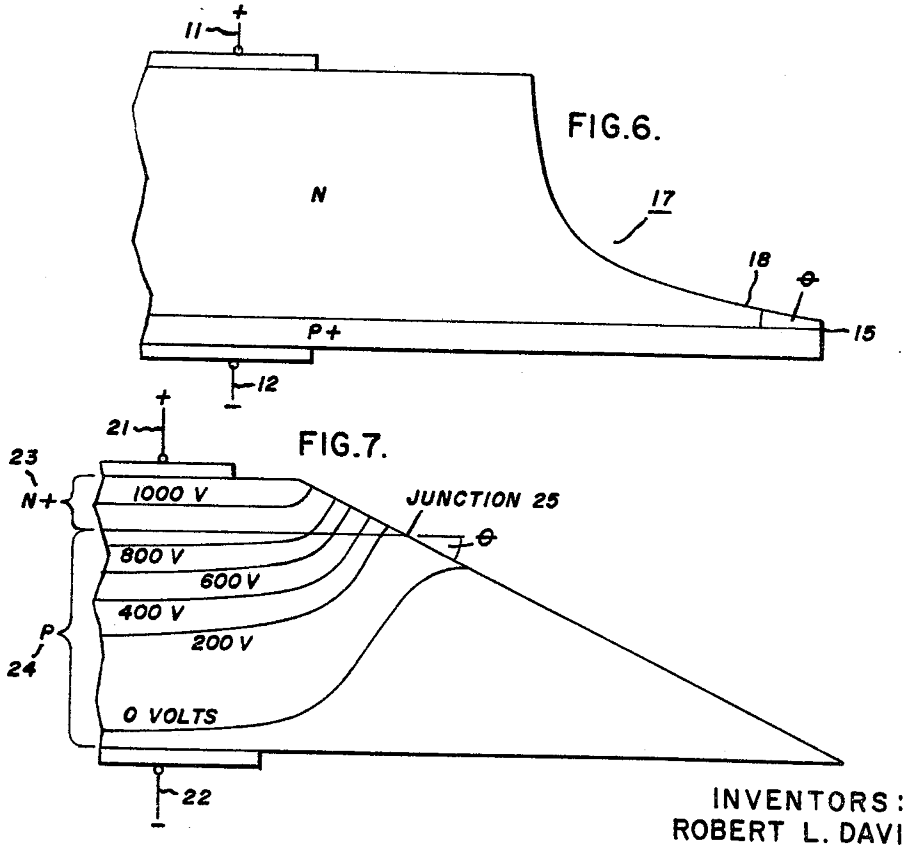
FIGURE 7 is a central vertical section taken through a pellet having a beveled surface which is in a reverse direction to the bevel of the device in FIGURE 1 (this bevel is called a reverse or negative bevel)
Figure 8:
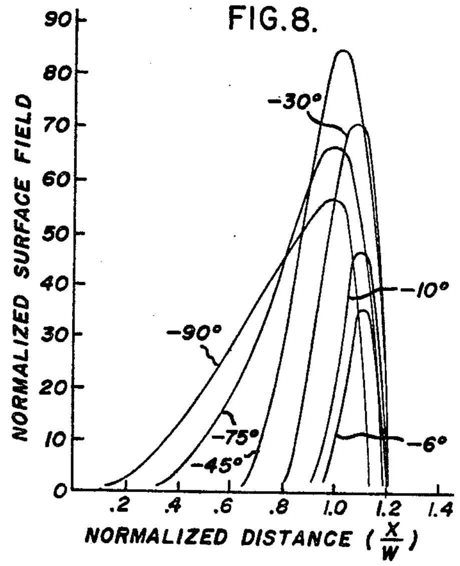
Figure 9:
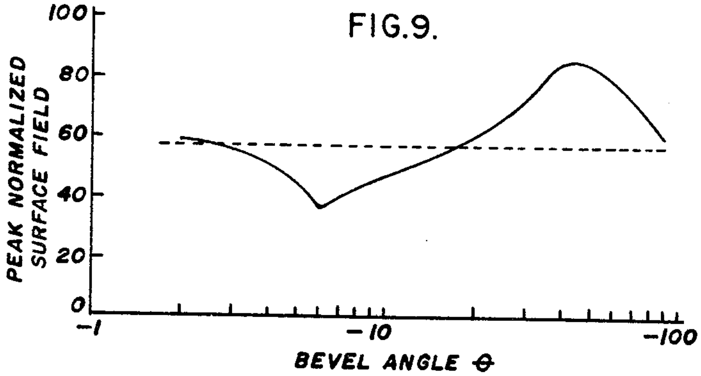
Figure 10:
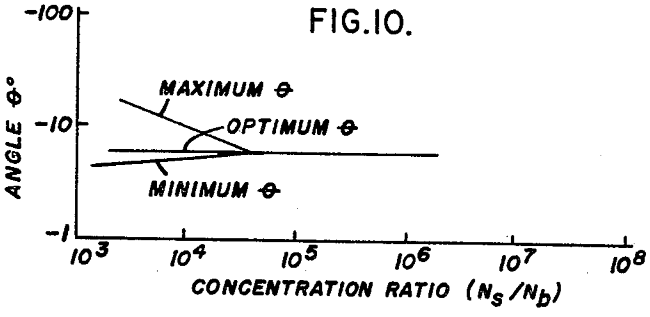
Figure 11:
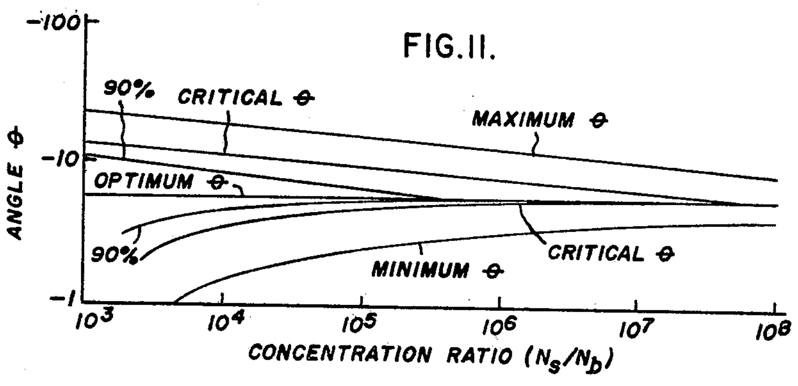
Figure 12:
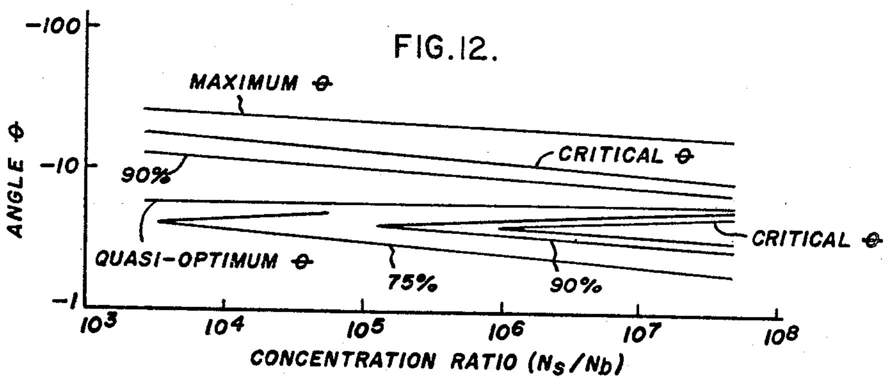
Figure 13:
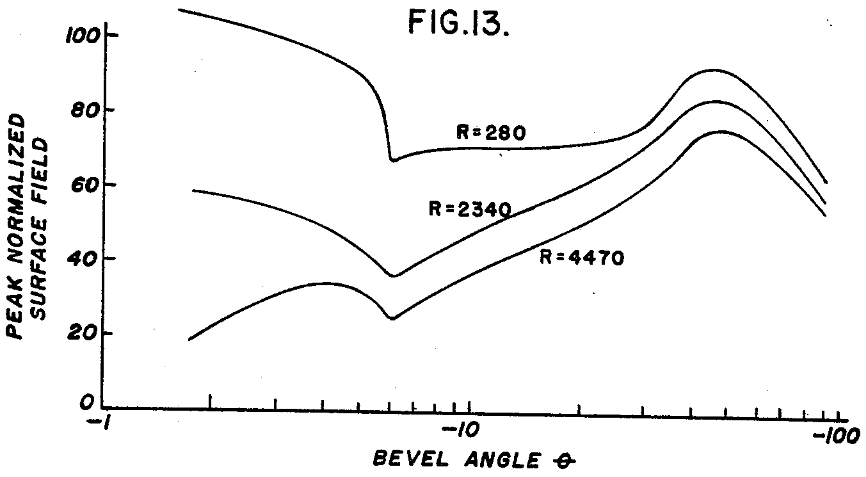
Figure 14:
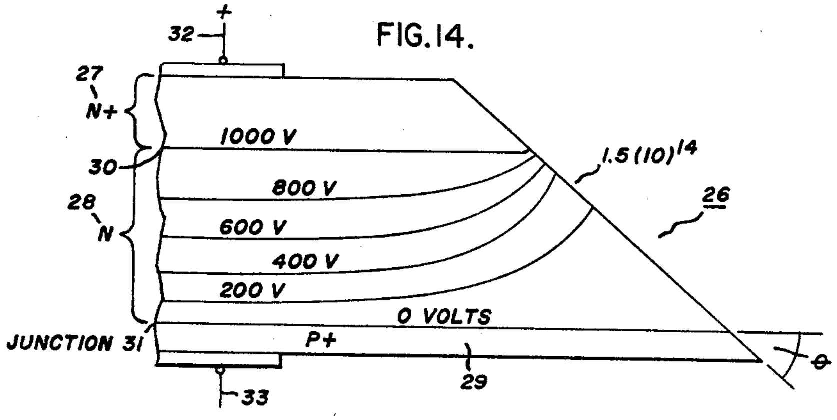
Figure 15:
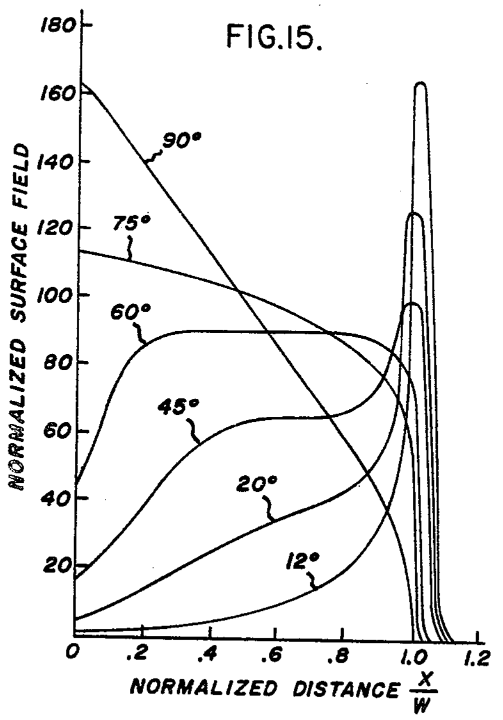
Figure 16:
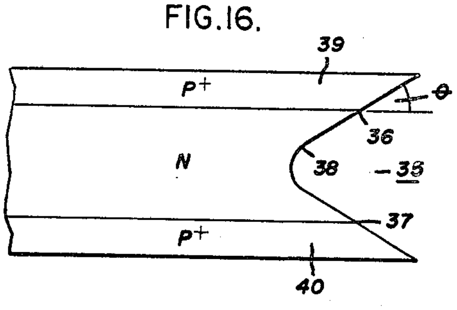
Figure 17:
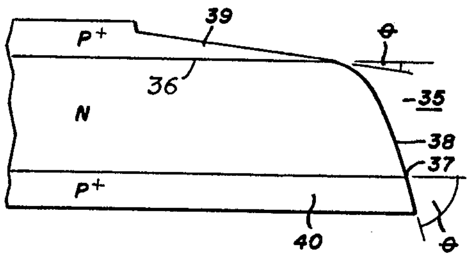
Figure 18:
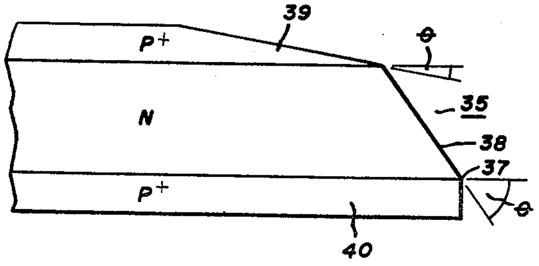
Figure 19:
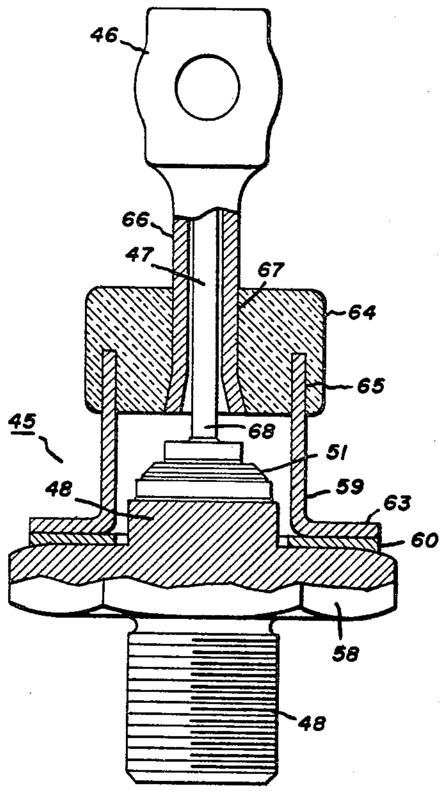
Figure 20:
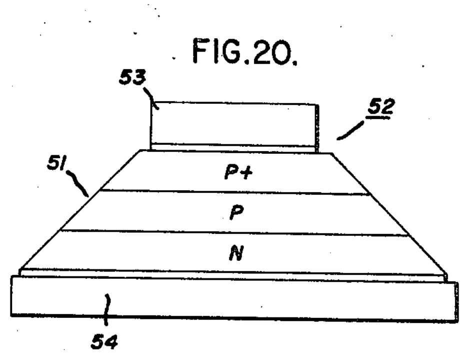
Figure 21:
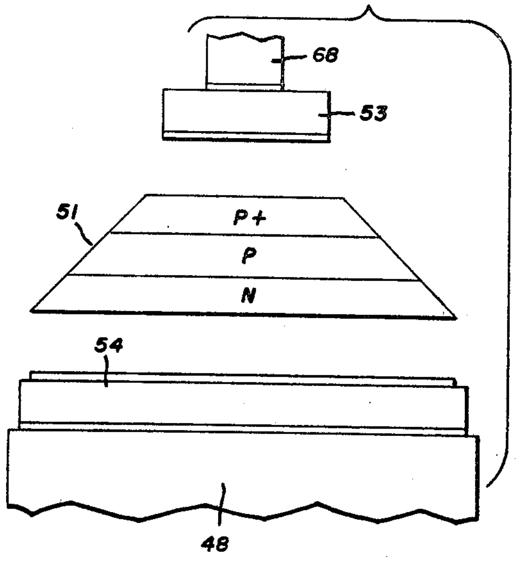
Figure 22:
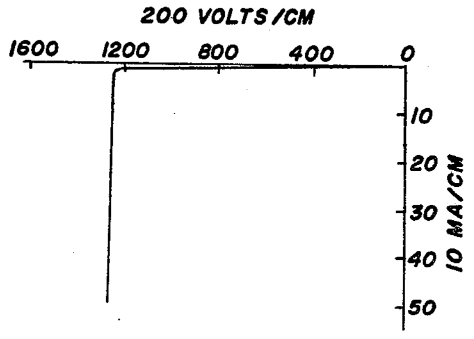
Figure 23:
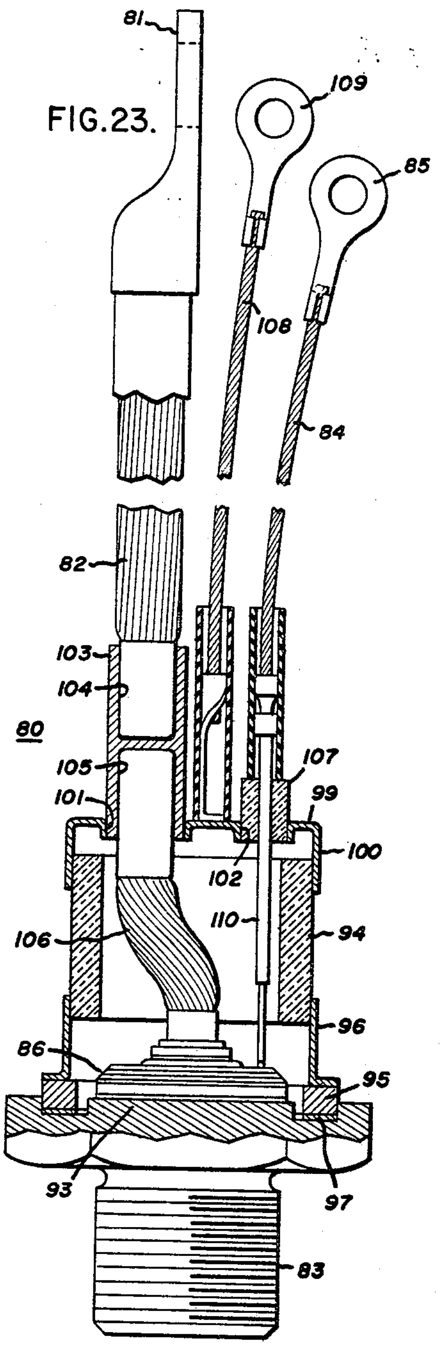
Figure 24:
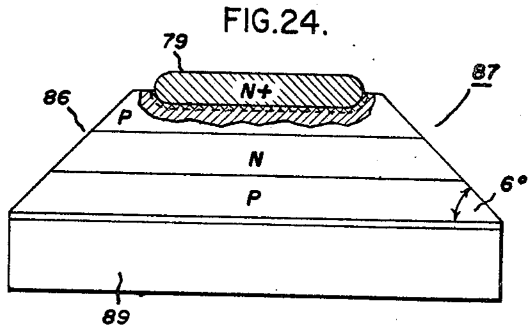
Figure 25:
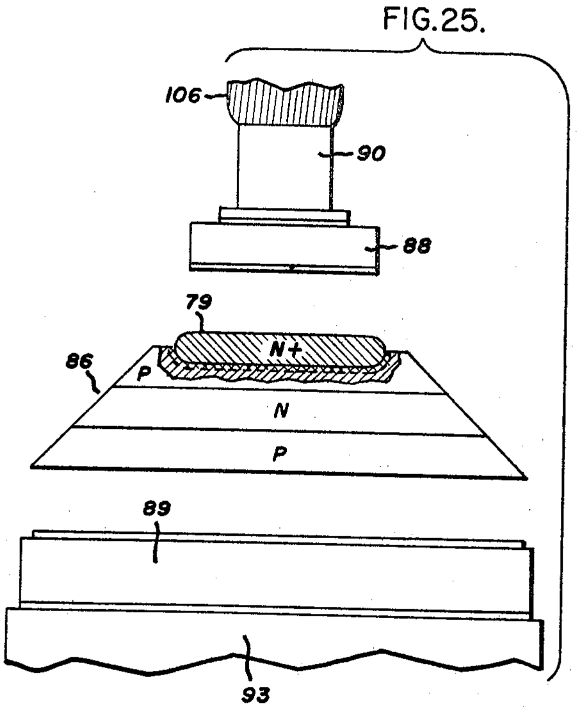

FIGURE 8 is a graph illustrating the normalized surface field (N.S.F.) plotted along the axis of ordinates and normalized distance ($X/W$) along the contoured surface of the pellet plotted on the axis of the abscissas for pellets contoured as illustrated in FIGURE 7 and for the different angles of contour indicated on each curve where X is distance in centimeters measured from the edge of the depletion region furthest from the PN junction;

FIGURE 9 is a curve illustrating the peak normalized surface field plotted along the axis of ordinates and the bevel angle theta ($\theta$) plotted along the axis of abscissas for the device of FIGURE 7;

FIGURES 10, 11 and 12 are curves which illustrate the bevel angle theta plotted against surface concentration ratio ($N_s/N_b$) where $N_s$ is the concentration of impurities at the surface after impurity diffusion and $N_b$ is the concentration of the impurities in the original bulk material for different values of a constant R (a measure of junction depth and uniform impurity concentration in the pellet), where $$R=2.72\times10^{-18}X_j^2N_b^{7/4}$$

where $X_j$ is the depth of the PN junction measured from the surface of diffusion, and $N_b$ is the impurity concentration in atoms per cubic centimeter, which curves are plotted for a negatively beveled pellet as illustrated in FIGURE 7;

FIGURE 13 shows three sets of curves, each for different junction depths with the peak normalized surface field plotted along the axis of ordinates and the negative bevel angle theta plotted on the axis of abscissas;

FIGURE 14 illustrates a vertical section of a pellet having two internal junctions or junctures and an internal region between the two junctions or junctures which has a higher resistivity than either of the two external regions;

FIGURE 15 is a graph illustrating the normalized surface field plotted along the axis of ordinates against the normalized distance ($X/W$) where X represents the distance from a point on the contoured surface to the PN junction of the device and W represents the width between device junctures (N region thickness) of the device illustrated in FIGURE 14;

FIGURE 16 is a vertical section through a 3-layer PNP pellet illustrating the optimum contour for such a device;

FIGURES 17 and 18 are also central vertical sections through 3-layer PNP pellets showing different contours which are compromises but which are highly satisfactory;

FIGURE 19 is a central vertical longitudinal section through a high current semiconductor rectifier constructed in accordance with the teachings of the present invention;

FIGURE 20 is an enlarged elevational view of the rectifying elements of the rectifier of FIGURE 19;

FIGURE 21 is an exploded and enlarged elevational view of the elements of FIGURE 20;

FIGURE 22 is a graph illustrating the reverse voltage breakdown characteristics of the semiconductor body of the rectifier illustrated in FIGURES 19, 20 and 21 which shows voltage (in volts) plotted along the axis of abscissas and current in milliamperes plotted along the axis of ordinates;

FIGURE 23 is a central vertical-longitudinal section through a high current semiconductor controlled rectifier constructed in accordance with teachings of the present invention;

FIGURE 24 is an enlarged elevational view partially in section of the rectifying element of the controlled rectifier of FIGURE 23; and FIGURE 25 is an exploded and enlarged elevational view partially in section of the elements of FIGURE 24.

Figure 1:
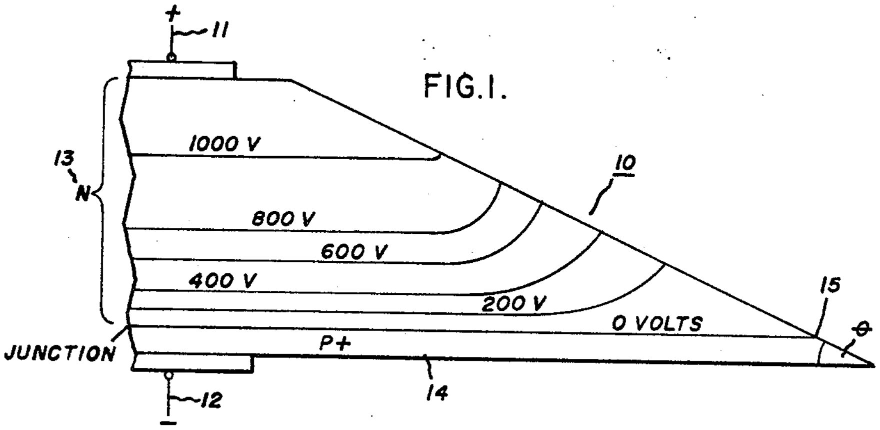
FIGURE 1 is a central vertical section through a segment of semiconductor pellet which utilizes teachings of the present invention and which is used to define terms and concepts of the present invention.

In FIGURE 1, the cross-section of a segment of a pellet 10 of single crystal semiconductive material such as silicon or germanium is depicted in a somewhat diagrammatic fashion. The pellet for many practical semiconductor devices will be circular so that it has the general shape of a round coin but it may have any other shape. In order to have a practical device it is necessary to provide low resistance electrical contacts 11 and 12 (ohmic contacs) on the two major faces of pellet 10. The pellet 10 has two internal regions of different conductivity types; viz, an upper region 13 of N-type conductivity adjacent to the upper major face and a region 14 of P-type conductivity adjacent to the lower major face. The boundary of juncture between the two regions or zones 13 and 14 defines a PN junction 15. The lower P-type zone 14 is marked P+ to indicate that it is very highly doped (has a large number of P-type carriers) and therefore is more conductive (has a lower resistivity) than the upper N-type region 13.

In order to establish the exact conductivities for later discussion it will be noted that the pellet 10 shown was a monocrystalline silicon pellet of N-type and having a resistivity of 18 ohm centimeters. The P-type layer was formed by diffusing gallium into the pellet to place the junction depth ($X_j$) at about 3 mils.

The pellet 10 is made bulk limited rather than surface limited (i.e., peak reverse voltage is limited by the voltage at which avalanche breakdown occurs in the interior of the semiconductor pellet body rather than being limited by the peak surface electric field) by reducing the peak surface electric field in the region of the junction 15 under conditions of reverse bias. Reverse bias occurs when a voltage is applied across the contacts 11 and 12 which is of a polarity which tends to force current across the junction in the high impedance direction; e.g., positive at the upper contact 11 on the N-type zone relative to the lower contact 12 on the P-type zone. (Note that some small reverse current usually flows across the junction before breakdown but it is so much less than the current which flows in the forward direction it may, for our purposes, be ignored.) The maximum electric field which exists along the peripheral surface of the pellet 10 is reduced below that in the bulk of the material by properly contouring the peripheral surface of the pellet 10.

The contour used to reduce the peak surface electric field on the pellet 10 is a simple bevel which reduces the cross-sectional area of pellet 10 going from the heavily doped side of the PN junction 15 (P+ zone 14) to the lightly doped side (N type zone 13). Or stated in another way, the side of highest resistivity has the smallest cross-sectional area when considering the cross-sections taken parallel to the junction 15 (or major faces). This type of bevel is defined as a positive bevel as opposed to a negative bevel which is exactly opposite. Another way to consider the reduction is to consider that the reduction in size of the pellet is parallel to the planes of the junction 15 and major faces or perpendicular to the direction of the main charge carrier flow (which in turn is perpendicular to the junction 15). At the pellet edge, the carrier flow is not truly perpendicular to the junction but the main flow is. The angle $\theta$ of the bevel for pellet 10 is six degrees (6°) as measured by the acute angle the bevel makes with the planes of the junction 15 and the major faces of the pellet.

The plot of voltage lines (labeled 0, 200V, 400V, etc.) show how the electric field (voltage gradient) is spread along the beveled surface and that the voltage gradient is lower, i.e. or spread out, at the beveled surface than in the bulk of the material. That is, the voltage per unit of distance along the bevel is much less than the voltage per unit of distance through the bulk of the material perpendicular to the electrode bearing surfaces. The general result of lowering the surface field is to cause the sharp avalanche breakdown in the bulk of the material and enhance the capability of the junction to absorb power without destruction.

Perhaps the effect of the surface contour on spreading of the electric field is best understood by returning to a consideration of the depletion region which forms at the junction 15 in the presence of the reverse voltage. As indicated previously, a number of impurity atoms on opposite sides of the junction are stripped of their compensating charges (charge cariers) in the presence of an electric field. The charges are stripped in such a manner that a charge balance is left in a region of uncompensated impurity atoms The region of uncompensated impurity atoms straddles the junction and is called the depletion region (of width W). This depletion region forms a dielectric.

By beveling the edge of the pellet 10 in the area of the PN junction 15, impurity atoms are removed which would normally be within the region of charge balance under the application of reverse bias. When the reverse bias is applied without the presence of these impurity atoms, impurity atoms further away from the PN junction 15 and in a direction along the surface contour must become a part of the region of charge balance. The total sum of charge on both sides of the junction 15, and contained within the depletion region, must be zero at equilibrium. Considering this resulting charge distribution, it is seen that the voltage lines must bend up (as shown) to meet the surface contour.

Figures 2, 3:
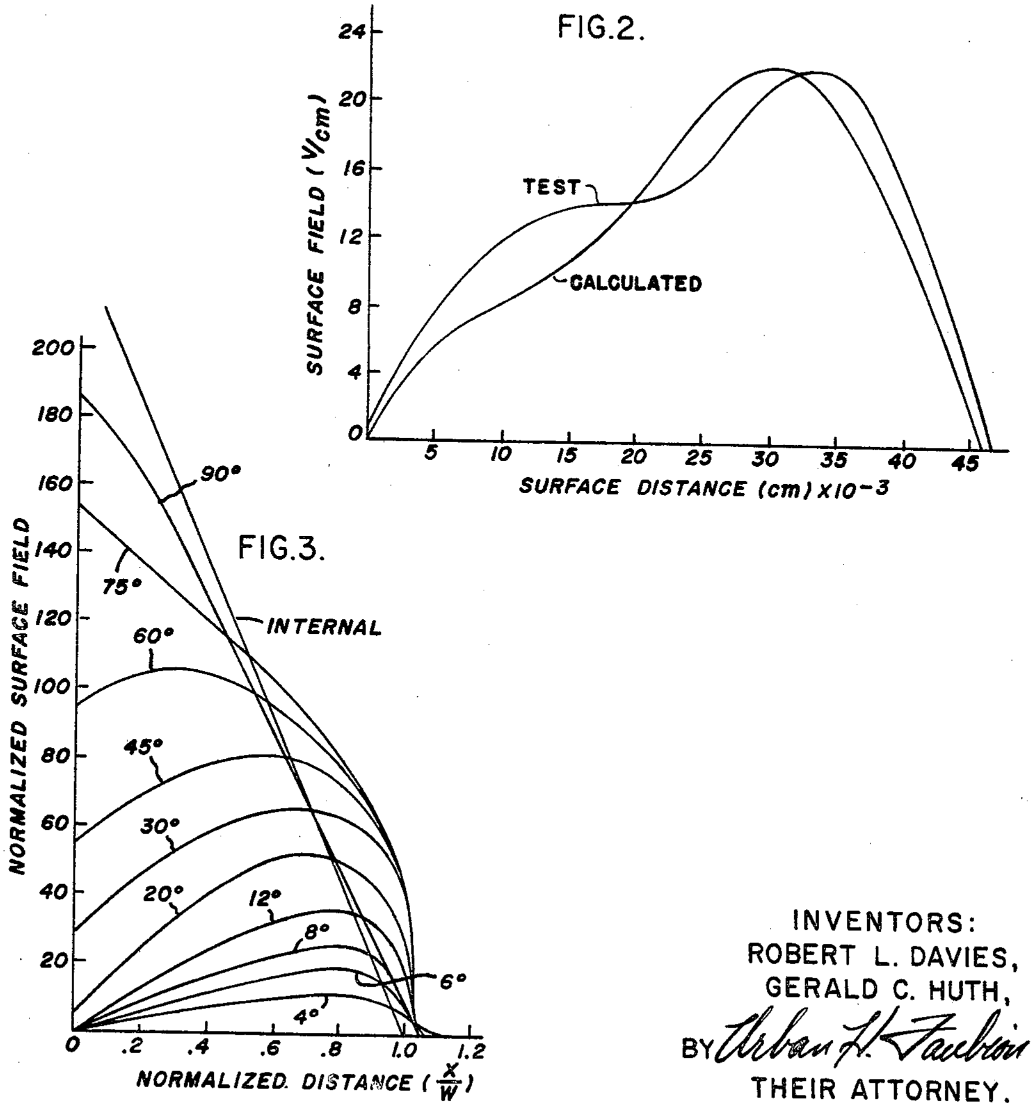
FIGURE 2 is a plot showing a calculated curve and a test curve of surface field in volts per centimeter plotted on the axis of ordinates and distance measured along the bevel surface from the PN junction plotted on the axis of abscissas for the device in FIGURE 1.
FIGURE 3 shows curves taken for different positive bevel angles (as in FIGURE 1) which illustrate the normalized surface field plotted along the axis of ordinates versus the normalized distance ($X/W$) (where X is the distance measured from the PN junction of the device to a point on the surface in FIGURE 1 and W is the width of the depletion region.

A better appreciation of the effect of the six degree surface bevel on the surface fields of the pellet 10 of FIGURE 1 may be had by referring to FIGURE 2 where pilots of calculated and probed data for the surface field (in volts per centimeter) are plotted along the axis of ordinates against distance along the surface contour from the junction 15 plotted along the axis of abscissas. Considering that the peak electric field for a PN junction with no surface contour occurs at the junction 15 and that the peak field of pellet 10 occurs at considerable distance (between $30\times10^{-3}$ centimeters and $35\times10^{-3}$ centimeters) toward the top contact 11 away from the junction 15, the effectiveness of the bevel can be seen. The electric field region is spread a greater distance along the surface contour from the junction 15 than in the bulk of the material and the peak electric field at the surface is considerably lower than that in the bulk.

As a matter of interest, the experimental and calculated curves agree very well. The experimental data was obtained by probing the surface of the pellet with a 3 mil tungsten probe and recording the voltage between one of the device contacts and the probe.

Figure 4:
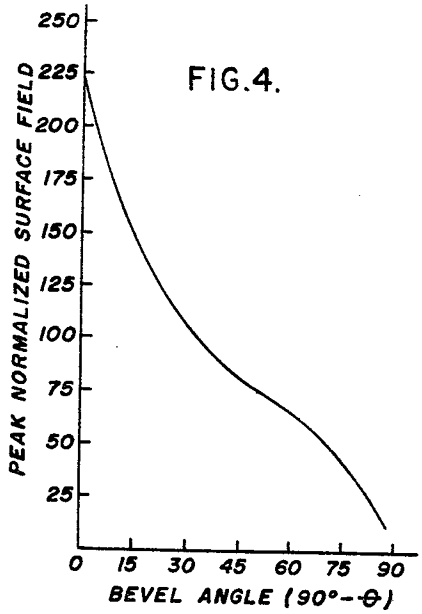
FIGURE 4 is a curve illustrating the peak normalized surface field plotted along the axis of ordinates versus the beveled angle ($90°-\theta$) plotted along the axis of abscissas for the device of FIGURE 1.

Actually, the six degree positive bevel used on pellet 10 is not optimum even if considerations are confined to an essentially straight bevel. This can be readily ascertained by reference to the curves of FIGURES 3 and 4 which apply to positively beveled junctions. In FIGURE 3 the effect of different bevel angles $\theta$ on the surface electric field is shown by plotting the normalized surface field N.S.F. along the axis of ordinates and the normalized distance ($X/W$) along the axis of abscissas. The normalized surface field N.S.F. is obtained from the following equation:

$$N.S.F.=\frac{E_t}{2.4\times10^{-6}\sqrt{(Nd-Na)Va}}$$

where ($Nd-Na$) is the net impurity concentration $E_t$ is the actual surface field in volts per centimeter and $Va$ is the applied reverse bias voltage. X is the distance from the junction as in FIGURE 2 and W is the width of the depletion region. From this graph (FIGURE 3) it is seen that the smaller the bevel angle $\theta$ the lower the peak surface electric field and as $\theta$ becomes smaller the peak surface field moves away from the junction 15 toward the upper contact 11. Also, the barrier (depletion region) at the junction surface continues to spread.

Possibly the effect of the bevel angle on surface electric field is better shown by the graph of FIGURE 4 where again the same normalized surface field is plotted along the axis of ordinates and a measure 90°—$\theta$ of the bevel angle is plotted along the axis of abscissas. From this curve it is seen that the peak field intensity decreases as $\theta$ decreases. The peak field is considerably reduced for bevel angles $\theta$ as large as 45°. However, for many devices the field at this value of $\theta$ is still too high for good breakdown characteristics.

Using present surface treatment practices for a silicon pellet such as pellet 10, the peak surface electric field associated with the junction of the pellet of FIGURE 1 (see FIGURE 2) provides a very stable device. A successful device can be obtained using two or three times this peak field. A critical field value that can be used as a rule of thumb with normal surface treatments is 125,000 to 150,000 volts per centimeter. If the pellet surfaces are carefully cleaned and maintained by protective coatings, even these values can be exceeded.

The positive beveled contour on the periphery of pellet 10 is only one of many possible contours. The straight bevel shown is a very practical contour since it is effective and can be much more readily obtained by simple cutting and lapping techniques than very complex contours. The bevel is also a reasonably good approximation to some of the more complex contours and the data given here is useful for many contours.

Figure 5:
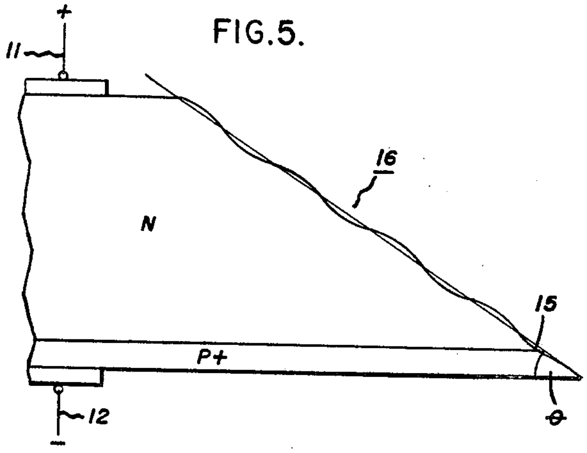
FIGURES 5 and 6 are central vertical sections through semiconductor pellets which utilize techniques of the present invention and which are used to define terms and concepts.

FIGURE 5 shows a pellet 16 with a contour which can be called a bevel. The bevel angle $\theta$ for the contour is the average angle. As illustrated, the contour undulates about the bevel angle in a near sinusoidal fashion although the undulations in a practical device might be quite irregular depending mostly upon the method of contouring the surface. This pellet 16 has a junction between P and N type zones as well as electrical contacts which correspond to like parts of the pellet 10 of FIGURE 1, therefore, corresponding parts are given corresponding reference characters.

Another type of positive contour is illustrated in FIGURE 6. Again, parts of the device which correspond to like parts in FIGURE 1 are given the same reference numerals. The contour on pellet 17 is generally referred to as a "mesa." This contour is most easily formed by conventional and well-known etching techniques. In any case, for best results the relatively flat land 18 of the mesa contour should be placed within the depletion region on the same side of the junction 15 as the mesa.

The contours can also be applied to a negatively beveled semiconductor pellet to accomplish similar results. That is, similar results can be accomplished by contouring a pellet in such a manner that the cross-sectional area parallel to the plane of major faces and junctions increases from the side of the junction of lowest resistivity to the side of highest resistivity.

A negatively beveled pellet 20 with an optimum angle $\theta$ for the bevel of six degrees (optimum for the particular pellet) is illustrated in FIGURE 7. The pellet illustrated is round so that it has the general shape of a round coin. For this pellet 20, there are provided upper and lower ohmic contacts 21 and 22 on the major faces for application of voltage to the device. The pellet 20 comprises an upper region or zone 23 of N type which is very highly doped and a lower region 24 of P type. The PN junction 25 is defined by the boundary of the two types of material. Since the upper region of N type material is most highly doped it has the lowest resistivity. The ratio of the surface impurity concentration $N_s$ of the N type zone 23 to that $N_b$ of the P type bulk material is $4\times10^4$. The particular pellet illustrated was formed by starting with the P type bulk material (in lower zone 24) and diffusing in N type impurities to a depth of 3 mils to form the upper zone 23.

It is difficult to visualize why and how the peak surface field can be reduced by a negative contour on the surface of the pellet 20. Therefore, the curves of FIGURES 8 through 12 inclusive are given to show how the surface contour affects the surface field. In the graph of FIGURE 8 the normalized surface field N.S.F. on the contoured surface is plotted along the axis of ordinates and the normalized distance ($X/W$) is plotted along the axis of abscissas. The normalized surface field N.S.F. is obtained from the following relationship:

$$N.S.F.=\frac{E_t}{2\times10^{14}(N_b)^{-3/4}}$$

where $E_t$ is the actual surface field in volts per centimeter and $N_b$ is the impurity concentration in the bulk material (original material) in atoms per cubic centimeter. In the case of the negative contour or bevel the distance X is measured (in centimeters) from the edge of the depletion region on the high resistivity side of the junction 25 to the point of interest. W in the graph of FIGURE 8 is the width of the depletion region on the high restivity side of the junction and is to be distinguished from the term as used in FIGURE 15.

The junction corresponds to the value 1 on the normalized distance scale. The origin 0 corresponds to the position of the edge of the depletion region on the high resistivity side of the junction where $X=0$. Using the bevel angle $\theta$ illustrated on the drawing of FIGURE 8, it is seen that the curve labeled —90° is for a pellet with no bevel (i.e. sides perpendicular to the plane of the junction 25.) The minus sign (—) is used to show that the bevel is negative. From the graph of FIGURE 8 it is seen that the peak electric field intensity along the surface contour increases from its 90° value as the angle decreases negatively. A maximum value of peak electric field is reached at minus 45° that is, about half way between the peak of the —30° and the peak of the —10° curve. The peak field intensity then decreases to its original value at approximately 20°. The location of the peak electric field is shifting into the highly doped diffusion region (toward the right on the graph beyond the point where $X/W=1$). As the angle continues to decrease negatively, the peak field continues to decrease until the location of the peak field is well into the region of lowest resistivity (the diffused N+ region 23). The peak electric field reaches a minimum at minus 6 degrees as shown in FIGURE 9. Because of the large impurity gradients existing in the diffused region 23, the advance of the peak electric field into this region is diminished and the magnitude of the peak electric field again increases with continued decrease of the negative angle as can best be seen from the left hand portion of the graph of FIGURE 9. In other words, the voltage lines (see FIGURE 7) are bent upward into the low resistivity region by a negative bevel. As the negative angle is reduced from 90° the voltage lines become more crowded at the surface (but further into the region of low resistivity 23) thus the voltage gradient (electric field) becomes higher. The lines continue to become more crowded in the zone 23 until an angle of about −45° is reached and then they start to spread until they are as far apart at the surface when the angle is −20 degrees as they were at 90° but they intersect the surface further from the lower major face of the pellet 20. As the negative angle is reduced the voltage lines continue to become further apart at the surface until the angle of minus 6° is reached, then the lines begin to become more crowded again.

To gain further insight into why the lines become more crowded and hence a minimum angle $\theta$ exists in the case of the negatively beveled diffused junction it is pointed out that had the low resistivity highly doped side 23 of the junction 25 been of a uniform impurity concentration, it is believed that the minimum $\theta$ would not exist (assuming no change in surface dielectric constant). The reason then is that the voltage lines (and peak electric field) are trying to spread into a region where the density of impurity atoms increases rapidly toward the surface. A larger electric field (or voltage gradient) is required to displace carriers in a region of high concentration than in a region of low concentration. Thus, the voltage lines begin to become closer together as they are bent further into the low resistivity region 23.

These results are shown in a different way in the graph of FIGURE 9 where the peak normalized surface field is plotted along the axis of ordinates against the negative bevel angle $\theta$ along the axis of abscissas. The reason for portraying the results in this manner is to show what looks like a discontinuity in the relation between peak surface field and bevel angle $\theta$ at about the angle for minimum peak field.

To consider the practical application of the results described above, one can see that in practical semiconductor devices it is definitely not desirable to have a surface field greater than that at 90°. Therefore, a maximum negative bevel angle in the case just given (it has a value of 20°) can be specified. All values of negative bevel angle $\theta$ larger than this value give surface field higher than the 90° value. Another value of bevel angle $\theta$ can be given for the optimum in field reduction from that of the 90° value. A minimum bevel angle value of $\theta$ exists below which a negatively beveled PN diffused junction has a peak surface field higher than that of a 90° beveled junction of the same construction.

The curves of FIGURES 8 and 9 apply for the pellet 20 illustrated in FIGURE 7. Before extending the results to show maximum, minimum, and optimum contour angles generalized, a ratio R which is used to reduce the number of variables in the equations plotted on the graphs of FIGURES 8 and 9 is introduced.

$$R=2.72\times10^{-18}X_j^2N_b^{7/4}$$

where $X_j$ is the junction depth measured from the surface of diffusion (centimeters) and $N_b$ is the impurity concentration of the bulk material (atoms per centimeter $^3$) (region 24) into which the diffusion is made. It is necessary to find such a ratio because the solution to the Poisson field for a diffused junction results in an equation with four independent variables (junction depth, $X_j$; surface impurity concentration, $N_s$; bulk impurity concentration, $N_b$; and bevel angle, $\theta$). In order to plot the results some of the variables must be combined. The ratio R was derived starting from an equation for the normalized charge density in the Poisson field and substituting the appropriate parameters. The normalization procedure used is similar to known procedures that can be found in the literature. Therefore, it is not repeated here. Further, it is not believed to be necessary for an understanding of the invention.

The curves of FIGURES 8 and 9 apply for all negatively beveled diffused junctions with a value of the ratio R of 2340 and ratio of surface to bulk impurity concentration ($N_s/N_b$) of $4\times10^4$. The curves of FIGURES 10, 11 and 12 show the contour angle $\theta$ plotted along the axis of ordinates and the surface to bulk impurity concentration ratio ($N_s/N_b$) plotted along the axis of abscissas. These curves show maximum, optimum and minimum angles for various surface to bulk concentration ratios ($N_s/N_b$) and for various values of the ratio R. These three plots cover a large range of diffused PN junctions. One of the salient characteristics to observe is that the optimum angle does not vary greatly from 6°. Furthermore, the large reduction in surface field intensity expected from the utilization of a negative bevel can be obtained only on diffused junctions with appreciable junction depth. The maximum angle does vary with surface concentration ratio and R but not drastically. The minimum angle varies more dramatically.

The wider the separation between the maximum and minimum angle the greater is the reduction in surface field of the optimum angle. The reduction in field is the reduction from the 90° value. Thus, because the 90° value of peak surface field is less for junctions than for shallow diffused junctions, there is a further decrease in field for junctions with low impurity gradient at the junction. To indicate the magnitude of the electric field intensity along the surface, a family of lines have been drawn on the graphs of FIGURES 11 and 12 which indicate the percent of the electric field on the surface compared to a value of electric field that has been somewhat arbitrarily chosen as the critical field. This value of critical field is 125,000 volts per centimeter and may not be the critical field under conditions of extreme cleanliness and good surface protection but the electric field intensities existing on practical avalanche devices now available have peak surface electric fields somewhat less than the critical value chosen.

The maximum and minimum curves as plotted in the graphs of FIGURES 10, 11 and 12 are described by the following equations:

$$\theta \text{ max.} = 38\times10^{-10}X_j^{0.95}\frac{N_b^{0.91}}{N_b^{0.075}}$$

$$\theta \text{ min.} = \left[.326\ln_e\left(\frac{N_s}{N_b}\right)-1\right][2.47-1.71\times10^{-21}X_j^2N_b^{7/4}]$$

within the limits $1°\leq\theta\leq25°$
$10^{16}\leq N_s\leq10^{21}$ atoms/cubic centimeter
$5\times10^{13}\leq N_b\leq10^{15}$ atoms/cubic centimeter
$2.54\times10^{-3}\leq X_j\leq10\times10^{-3}$ centimeters These equations apply where the dielectric on the surface of the pellet is air. If a material is applied to the surface which has a dielectric constant greater than air the range between the maximum and minimum is extended and the optimum angle may change somewhat. For example, where the dielectric on the surface of pellet 20 is a material such as a glass with a permittivity of 11.8 the optimum angle changes from six degrees to five degrees. Very practical limits of the bevel angle for the pellet 20 without the dielectric material on the surface is between four and nine degrees. The addition of the dielectric (permittivity 11.8) extends these limits to between about one and 16 degrees.

The effect of diffusion depth (junction depth $X_j$) is illustrated by the family of curves in the graph of FIGURE 13. This graph again shows angle of the bevel $\theta$ plotted against the peak normalized surface field N.S.F. as in the graph of FIGURE 9. These curves are plotted for the pellet 20 having a bulk impurity concentration $N_b$ of $2.5\times10^{14}$ atoms/cc., a surface impurity concentration of $10^{19}$, and junction depths $X_j$ of 1, 3 and 4 mils respectively which give values of the ratio R of 280, 2340, and 4470 respectively (as for curves of FIGURES 10, 11, and 12 respectively). It is seen that varying the diffusion depth $X_j$ does not change the optimum angle $\theta$ but that the peak normalized surface field N.S.F. can be reduced by diffusing deeper.

Another pellet structure of interest is illustrated in FIGURE 14. The pellet 26 illustrated has 3 regions of different resistivities. As illustrated, the upper region or zone 27 is a highly doped region of N type conductivity (called N+ because it is highly doped and hence of low resistivity), a middle zone 28 of higher resistivity (less highly doped) N conductivity type material and a lower zone 29 of P type material which is highly doped and of low resistance. Thus, there is a central zone 28 of higher resistivity separating two low resistivity zones 27 and 29 of opposite conductivity types the transitions 30 and 31 from the high resistivity central zone 28 to each of the low resistivity outer zones 27 and 29 respectively are abrupt and substantially planar. These planar transitions are called junctures between zones. The lower juncture 31 is also a junction (rectifying) since the transition is between zones 28 and 29 of different conductivity type.

The pellet 26 illustrated is formed by starting with a bulk material (silicon) of N type conductivity and impurity concentration $N_b$ of $1.5\times10^{14}$ atoms per cubic centimeter and diffusing in a P type impurity (boron) to form the lower P type zone 29 which is 2.5 mils thick and which has a surface impurity concentration $N_s$ of $7\times10^{18}$ atoms per cubic centimeter. The upper N type region is diffused in to a depth of 2.5 mils into the lower N type region and has a surface impurity concentration of $10^{19}$ atoms per cubic centimeter (phosphorous diffused). The central zone 28 of bulk material is about 2 mils thick. Ohmic contacts (32 and 33) are applied to the upper and lower major faces respectively of the pellet so that a voltage can be applied. Using the impurity concentrations given above, the impurity concentration ratio $N_s/N_b$ is $4\times10^4$ atoms per cubic centimeter where $N_s$ is the impurity concentration of the lower zone 29 (adjacent to the junction 31) and ratio R:880. The surface of the pellet 26 is provided with a bevel contour which is considered positive since it crosses the junction 31 in such a way that it reduces the cross-sectional area of pellet 26 in planes parallel to the plane of the junction 31 going from the low resistivity side of the junction (region 29) to the high resistivity side (zone 28). The bevel makes an angle $\theta$ of 12 degrees with the plane of the junction.

The voltage lines shown in the pellet 26 (FIGURE 14) are for 1000 volts applied between contacts 32 and 33 with the upper terminal 32 positive relative to the lower 33. The curves of FIGURE 15 which show normalized surface field N.S.F. plotted along the axis of the ordinates and normalized distance ($X/W$) plotted along the axis of abscisssas were also taken for this condition. For this device, the normalized surface field is obtained from the equation $$\text{N.S.F.}=E_t/2V_a$$

where $E_t$ is the surface field at the position considered and $V_a$ is the voltage applied between outer ohmic contacts 32 and 33. W is the width of the high resistivity region and the distance X is measured from the actual junction 31 toward the upper juncture 30. The resistivity of the middle region is not intrinsic, but allows the barrier to spread entirely across the middle region for the applied bias shown. The curves show that as the positive angle is reduced from 90° the field intensity at the surface is reduced to a minimum at about 60° for this particular junction. With further reduction in positive angle the electric field which has now shifted from the junction side of the middle region 28 to the upper diffused region side of the middle region 28 increases with decreasing angle. At a value of about 12° the peak surface field has again increased to its original 90° value. A further decrease in positive angle increases the peak surface field even further.

For the case of the PNN+pellet 26 under consideration where the barrier has spread entirely across the middle region 28, the maximum angle is 90°. The optimum angle is somewhere around 60 and the minimum angle somewhere around 12°. This is also true for a structure with the conductivity of the central region 28 of opposite type (i.e. a P+PN structure) but the junction for such a structure would be the juncture between the P and N conductivity type material and the bevel would be reverse to that shown. Because of the fact that the reduction of surface field even at the optimum angle of 60° is not as great as for other pellet structures, it is advisable when at all possible not to allow the barrier to spread entirely across the middle region 28. This is accomplished by adjusting the resistivity of this region. The device can then be beveled as a positive contoured device with considerable reduction in surface field possible. These results can be applied where the depletion region spreads across the entire central zone 28.

The general structure of pellet 26 with the zones of P+PN and the contour etched increased the avalanche voltage from a normal 1000 to 1200 volts in the reverse direction (for vertical sides) to greater than 2200 volts. More importantly, the contoured structures were undamaged by the bulk breakdown whereas the uncontoured devices were, for all practical purposes, rendered useless by the reverse breakdown.

A number of practical devices require the use of multijunctions (as distinguished from one junction and/or one junction and additional junctures which are not junctions) pellets. Note that the distinction is made between a junction which is defined by a change from material of one conductivity type to material of another conductivity type whereas a juncture is considered to include a junction and an abrupt change from material of one conductivity type to material of the same conductivity type which has a markedly different resistivity. For example, the abrupt transition from material of P type to a more highly doped (lower resistivity) P+ type is considered a juncture. For example, FIGURES 16, 17 and 18 illustrate common pellet types employing the inventive concept. Since these pellets 35 are alike in all respects except surface contours, corresponding parts are given corresponding reference numerals. Each of the pellets 35 has two essentially planar rectifying junctions 36 and 37 (upper 36 and lower 37 respectively) defined by a central separating region 38 of one conductivity type (N type shown) surrounded by upper and lower zones or regions 39 and 40 respectively of opposite conductivity type (P type illustrated). The present discussion applies equally well where the conductivity type of all zones are reversed to give a NPN structure but in general, the central zone 38 will be of higher resistivity than either of the outer zones 39 or 40.

For a three layer two junction device the philosophy still entails employing a contour which reduces the electric field at the surface below that at which the device avalanches through the bulk and the best contour is one which most evenly distributes the electric field at the surface. A desirable contour is arrived at by considering each junction separately and utilizing the teachings given above.

For example, consider the pellet 35 of FIGURE 16. The central region 38 is common to the depletion region of both junctions 36 and 39 and is of higher resistivity than either of the outer regions 39 or 40. Therefore, a near optimum contour can be obtained by applying a positive contour to each of the junctions 36 and 37. This results in a pellet 35 which looks very much like an ordinary pulley if we assume a round pellet. In other words, the double bevel is applied so that the cross-sectional area of the pellet is smaller in the central region 38 than at either of the outer zones. The angle $\theta$ at which the bevels cross the planes of junctions 36 and 37 may be as small as practical or possible since the bevels are positive, but six degrees is very satisfactory. This type of bevel is obtained by known selective etching techniques.

Another type of contour for a three zone two junction pellet is a bevel on one junction which is positive and a bevel on the other which is negative. This can be accomplished by a single bevel which crosses both junctions, as will be seen later with respect to the controlled rectifier illustrated in FIGURES 23 through 25, or by considering the angle of each bevel separately and optimizing the angle at each junction. The pellets of FIGURES 17 and 18 employ this approach.

For example, the pellet illustrated in FIGURE 17 uses a negative bevel on the upper junction 36 since the bevel makes the cross-sectional area of the highly doped upper P type region 39 less than that of the centrally located N type region of higher resistivity. The angle chosen for this bevel is about six degrees (relative to the plane of junction 36). The contour then steepens so that the lower junction is crossed at a steeper positive angle of about 60 degrees. This angles is selected using the previous teachings so that the electric field in the region of lower junction 37 is no higher than in the region of the upper junction 36 and the maximum surface field is low enough so that avalanche breakdown occurs in the bulk of the pellet 35 rather than over the surface.

The same principles are applied to achieve the surface contour of the pellet 35 illustrated in FIGURE 18. About the same six degree negative bevel is applied at the upper junction 36 as for the pellet illustrated in FIGURE 17. However, a second straight bevel is applied across the central region 38 down to the lower junction 37. This bevel is positive and crosses the lower junction at an angle $\theta$ of about 45 degrees. Some material is saved by using a pellet which is only large enough for the second bevel to come to the lower junction. Thus, the side of the lower zone 40 is vertical.

Using gallium diffused PNP pellets it was observed that providing a bevel across the junctions changed the characteristics abruptly from a gradual (soft) surface dominated breakdown in the 500 to 700 volt range to a very sharp bulk avalanche breakdown at 900 to 1000 volts, the appropriate avalanche point for the base resistivity and junction depth of the particular pellets. These pellets utilized 15 to 40 ohm centimeter N type bulk material with an approximate 3 mil P type gallium penetration on both sides. With a straight bevel across both junctions at an angle of six degrees (not optimum for both) the surface breakdown voltage of both junctions was increased beyond the 1000 volt bulk avalanche point for these pellets. Possibly more important is the fact that these pellets passed vastly increased amounts of current in breakdown without destructive effect than is possible where surface breakdown occurs. Typical values for pellets 600 mils in diameter is 50 to 60 amperes at 1000 volts without hint of instability.

A semiconductor junction type diode rectifier utilizing teachings of the present invention is illustrated in FIGURES 19 through 21 inclusive and described in connection therewith. The rectifier is provided with a sealed, self-contained housing which is referred to generally by the reference numeral 45. The device is called a diode rectifier because it normally conducts current in only one direction between two main terminals. That is, the device conducts current readily in a main conduction path between an upper flat lead terminal 46 on the main conductive lead 47 through the body of the device to a lower threaded bolt-like terminal and heat sink 48 but offers a very high resistance to current flow in the reverse direction. For this reason the upper terminal 46 and the lower terminal 48 are frequently referred to as the rectifier anode and cathode.

The rectifying action is provided by the disc-shaped semiconductor pellet 51 (best seen in FIGURES 20 and 21) which is an element in the main conduction path. The rectifying semiconductor pellet 51 is a monocrystalline semiconductor material (silicon in this case) similar to pellet 26 of FIGURE 14 except that it is a P+PN pellet. That is, the pellet has an upper region of highly doped P type material (labeled P+) formed by diffusing boron into a P type base material which forms the central region (labeled P) to form a juncture between the low resistivity P+ zone and the higher resistivity P type zone, and an N type dopant (phosphorous) is diffused into the lower surface of the pellet 51 to form the relatively low resistivity lower zone of N type conductivity (labeled N). The juncture between the central P type zone and the lower N type zone forms a rectifying junction. In the particular rectifier unit illustrated the semiconductor pellet 51 is 250 mils (¼ inch) in diameter and about 9 mils thick. This thickness may be visualized by considering that it is a little thinner than the pieces which would result if a dime were sliced along one edge into four equal parts. Each of the three regions is about 3 mils thick. According to the teachings given in connection with this type of pellet 51 (see discussion of FIGURES 14 and 15) the pellet is contoured in such a manner that the area diminishes from the low resistivity side of the junction to the high resistivity side. In other words, the largest cross-sectional area is at the lower N type zone and the cross-sectional area diminishes toward the junction between P and N type zones. The contour is etched in such a manner that the contour resembles a continuous straight bevel which makes an angle of 10 to 12 degrees with the plane of the junction.

Since semiconductor materials are very brittle, and since such a thin piece is extremely fragile, it is necessary to provide support and protection for the pellet. This is done by "sandwiching" the pellet 51 in a protective diode assembly or rectifier sandwich 52. This sandwich 52 is referred to as the active element of the rectifier.

The remainder of the sandwich or diode assembly 52 includes an upper backup plate 53 and a lower backup plate 54 and the materials (solders) which hold them together. Due to the electrical conduction and heat dissipation problems, the upper and lower backup plates 53 and 54 are made of a material which has good thermal electrical conductivity. Due to the extreme temperature excursions to which the device may be subjected the materials are also selected so that their thermal coefficient of expansion closely corresponds to that of the semiconductor pellet 51. Tungsten is the material used in the device illustrated but molybdenum is also satisfactory.

The upper and lower supporting plates 53 and 54 are secured to the semiconductor pellet 51 by means of solders. In this case, the solder used may be one of the conventional silver base solders.

The rectifier sandwich 52 is secured between the main current conductors 47 and 48. A good thermal and electrical connection is made between the rectifier sandwich and the cathode terminal (copper stud) 48 by the simple expedient of mounting the lower backup plate 54 directly on an enlarged disc-like head 58 on the copper stud 48. Thus, electrical terminal 48 is a good heat sink and constitutes a threaded bolt or stud with an enlarged disc-like head 58. The threads on the anode 48 are provided so that the entire unit may be easily secured to a terminal board or other heat dissipating means. Further to facilitate securing the device to a terminal board, the enlarged head portion of the conductive stud 48 is provided with a hexagonal outer periphery to accommodate a wrench or other torque applying tool.

The rectifying sandwich 52 is hermetically sealed in the housing 45 which utilizes the conductive stud 48 as the housing base. The side of the housing 45 is formed of a cylindrical metal member 59 which has an outwardly extending metal flange 63 at its lower periphery. The housing side 59 is sealed to the stud head 58 by means of an annular metal weld ring 60 and the metal flange 26. The annular metal weld ring or washer 60 is brazed to the top of the stud head 23. The outwardly extending flange 63 on the cylindrical metal side 59 is welded to the top of the weld ring 60 along its upper surface to provide a hermetic seal.

The top of the housing is formed by a cylindrical ceramic plug 64 which is provided with an annular groove 65 in its lower surface which fits over the upper edge of the cylindrical side wall 59 and is sealed thereto.

In order to provide a tubulation for evacuating the housing 45 and also provide a lead through for the main anode conductor 47, the ceramic plug has a tube 66 of conductive material sealed in a centrally located aperture 67. An internal anode conductor 68 which is connected to the upper backup plate and contact 53 extends up inside the tubulation 66. After evacuation, the tubulation is pinch sealed around the upper conductor 68 to form a hermetic seal and complete the main current path through the device from the upper terminal 46 to the lower stud 48.

In order to show the sharp avalanche characteristics of the device when it breaks down in the reverse direction (voltage on stud 48 positive with respect to that on anode terminal 46), the graph of FIGURE 22 is presented. Reverse current is plotted along the axis of ordinates and reverse voltage along the axis of abscissas for a typical rectifier of the type just described with an 800 volt peak reverse voltage rating. It is seen that little reverse current flows until almost 1300 volts is applied in the reverse direction. When breakdown does occur it is of the sharp bulk avalanche which can occur repeatedly without damage to the unit and without causing the device to be unstable.

A device which utilizes a multijunction pellet is illustrated in FIGURES 23 through 25. The device illustrated is a three-terminal silicon controlled rectifier. The operation of the silicon controlled rectifier illustrated is not described in detail here since a complete understanding of the operation of the device is not essential to an understanding of the invention and, further, the operation of such devices is discussed in a number of publications which are easily accessible. For example, the operation is described in chapter 1 of the General Electric Controlled Rectifier Manual, copyright 1960, by the General Electric Company.

For this portion of the description, it should be sufficient to say that the main conduction path through the rectifier unit 80 is between a lower threaded bolt-like conductive terminal and heat sink 83 through the body of the device and an upper flat lead terminal 81 on the main or cathode conductive lead 82. The main conduction path is described in detail subsequently. Conduction does not take place in the opposite direction and the conduction which does take place is controlled in accordance with the characteristics of the device by a current (called a gate current) supplied to the rectifier through a gate lead 84 that extends out the top of the housing 99 adjacent to the cathode lead 82. The gate lead 84 is also provided with a flat conductive terminal 85 at its upper end. Since current flow through the device takes place from the lower stud 83 through the body of the device to the upper conductive lead 82, the upper conductive lead 82 is frequently considered the device cathode and the lower stud 83 is considered the anode.

The active control element of the device, that is, the part of the device which provides the rectifying and control action is the disc-shaped rectifying semiconductor pellet 86 (best seen in FIGURES 24 and 25) which is an element in the main conduction path. The semiconductor pellet 76 is a monocrystalline semiconductor material (silicon in the device illustrated) with three junctions between four layers which are of alternate conduction types. That is, the four layers alternately have an excess of free electrons (N type conduction characteristics) and an excess of positive holes (positive or P type conduction characteristics). Such a device is described as a P-N-P-N semiconductor switch. This semiconductor material is the central element of the sandwich 87. In the particular unit illustrated, the semiconductor 86 is 800 mils (a little more than ¾ inch) in diameter and 9 mils thick.

Again, such a thin piece of very brittle material is extremely fragile and requires support. As a consequence, the semiconductor pellet 86 is included in the protective sandwich structure. The remainder of the sandwich or diode assembly 87 includes a pair of disc-shaped backup plates 88 and 89 which support the fragile semiconductor pellet 86, act as conductive contacts and form the outer layers of the sandwich 87. The backup plates 88 and 89 are also preferably of a material (such as tungsten or molybdenum) which has good thermal and electrical conductivity and a thermal coefficient of expansion which closely matches that of semiconductor material. In the embodiment illustrated the diameter and thickness of the backup plates 88 and 89 are proportioned so that stress transmitted to the semiconductor pellet 86 due to thermal excursions are reduced to acceptable levels. As discussed in detail in Patent 3,172,068, Semiconductor Device, Ser. No. 100,982, filed Apr. 5, 1961 in the name of Robert L. Davies and assigned to the assignee of the present invention, this result is accomplished by making the lower plate 89 thicker and larger in diameter than the upper plate. In the device illustrated, for example, the lower backup plate 89 is 800 mils in diameter (the same as the pellet 86) and 80 mils thick (about twice as thick as a dime) and upper backup plate 88 is 570 mils in diameter (a little over ½ inch) and 10 mils thick.

The pellet 86 of the device illustrated is formed by taking silicon of N type conduction characteristics (an excess of electrons) and diffusing with an acceptor material (gallium is used for the device illustrated) to form layers of material having positive conduction characteristics on opposite sides of the central layer of N type material and a thin layer of aluminum is vapor deposited on one side of the pellet 86 for use in subsequent mounting operations. The pellet 86 is positioned on the lower backup plate 89 with its aluminum deposit next to plate 89 and a gold-antimony preform is placed on the top of the pellet. This assembly is heated so that the aluminum on the bottom of the pellet brazes or mounts the pellet 86 to the lower tungsten backup plate 89 and at the same time the gold-antimony preform is alloyed into the top central region of the pellet 86 to form an N+ type regrowth region. Thus, the pellet 86 has four conduction layers of alternate conduction type characteristics separated by three junctions and the top portion of the melted gold-antimony preform comprises a contact member 79 which is a ternary of gold-antimony and silicon.

The three conduction regions which extend out to the edge of the pellet 86 are each about 3 mils thick and form a PNP structure as discussed relative to the pellets 35 illustrated in FIGURES 16, 17, and 18. The teachings discussed are put to good advantage by applying a single bevel across the three lower regions and thus junctions which forms an angle $\theta$ of six degrees with the planes of the junctions. The bevel reduces the cross-sectional area of the pellet 86 from the bottom toward the top since the central or internal N type region is of higher resistivity than either of the P type regions which it separates the bevel is positive for the lower junction and negative relative to the next junction (between the internal N and P regions). This angle is optimum for the negatively beveled junction and quite good for the positively beveled junction. This bevel has eliminated The gold-antimony melts down into the central portion of the surface of pellet 86 but a part protrudes or extends above the surface. It is this portion of the contact 79 which forms the surface to which the upper backup plate 88 is attached. The contact 79 and upper backup plate 88 form a part of the device cathode circuit. The portion of the cathode conductor 82 which is inside the housing 80 is provided with a conductive ferrule member 90 around its lower end which is secured to the upper surface of the upper backup plate 88 by a solder which may, for example, be the gold-tin eutectic described and claimed in the copending patent application entitled "Semiconductor Devices," Ser. No. 175,433, filed Feb. 26, 1962 by Joseph K. Flowers and William F. Lootens and assigned to the assignee of the present invention. This assembly is then placed upon the semiconductor pellet with a preform of solder (again preferably the gold-germanium solder described above) inserted between the contact member 79 of pellet 86 and the upper backup plate 88. The pellet 86 and lower backup plate 89 are placed upon the enlarged head or pedestal 93 of the copper stud 83 with a preform of a gold-tin solder positioned between the lower backup plate and the head 93 of the copper stud 83. The entire assembly is then heated to a temperature which allows the joints between the upper backup plate 88 and pellet 86 between the lower backup plate 89 and the head 93 of the cooper stud 83 to be formed at one time. The resultant device is a laminar assembly of different materials.

In the device illustrated the contact member 79 is 630 mils in diameter and the upper back-up plate 88 is 570 mils. Thus a 30 mil clearance is provided between the outer periphery of the top backup late 88 and the outer perhiphery of the contact member 79. This reduces the stress in the device so that pellet fracture is no problem during assembly or for thermal cycling between 150° C. to −65° C.

The recitifier sandwich 87 is secured between the main current conductor 82 (the cathode conductor) and the anode conductor which comprises the copper stud 83. The control exerted on the current conducted through the main current path is applied to silicon pellet 86 by means of the gate lead 84 which is connected to the P type material which is the second layer from the top of pellet 86. The heat sink and electrical anode terminal 83 constitutes a threaded bolt or stud with the enlarged disc-like head. The thread on the anode terminal stud 83 is provided so that the entire unit may be easily secured to a fin or other heat dissipating means using a nut on the other side of the fin. Further to facilitate securing the device to a heat dissipating member, the enlarged head portion 93 of the conductor stud 83 is provided with a hexagonal outer periphery to accommodate a wrench or other torque applying tool.

The recitifying sandwich 17 is hermetically sealed in the housing 80 which utilizes the conductive stud 83 as the housing base. The side of the housing 80 is formed to the cylindrical ceramic member 94 which insulate the upper electrical connection (cathode 82) from the anode stud 83. The housing side is sealed to the stud head 93 by means of an annular metal weld ring 95 and a cylindrical metal skirt 96. The annular metal weld ring 95 is brazed in an annular groove 97 coaxially positioned in the top of the stud head 93. A lower outwardly extending flange on the cylindrical metal skirt 92 is welded to the top of the weld ring 95 along its upper surface to provide hermetic seal. The inner periphery of the skirt 96 extends up around the outside of the lower part of the ceramic side 94 and a seal is made by any conventional metal-to-ceramic sealing means. The metal skirt has some flexibility in order to accommodate expansion differentials between the parts with temperature excursions.

The top of the housing is formed of a metal header 99 which is more or less disc-shaped with a downwardly extended cylindrical skirt 100 around its outer periphery. The skirt 100 extends down around the top of the ceramic side 94 and is sealed thereto by conventional metal-ceramic seal techniques. The header is provided with a pair of apertures 101 and 102 to accommodate lead throughs for the main or cathode lead 82 and gate lead 84 respectively. The lead through for the main cathode conductor 82 includes a cylindrical copper plug 103 which is sealed in the aperture 101. The plug 103 is provided with cylindrical apertures 104 and 105 in its upper and lower ends respectively to receive the lower end of the outer portion of the cathode conductor 82 and the upper portion of the internal part 106 of the cathode conductor.

As illustrated the gate lead aperture 102 is near the right side of the drawing and a cylindrical ceramic plug 107 is sealed within the aperture in a manner similar to the way a cork fits in a bottle. The internal and external portions of the gate lead 104 are connected by welding them inside and outside the sealed upper end of a conductive lead through 110 which is sealed inside the ceramic plug insulator. In addition to the electrical connections thus far described, another conductor 108 provided with a flat conductive terminal 109 is fixed to the upper conductive header 99 as a means of establishing a reference voltage for the cathode. It should be noted that the plug 107 for the gate lead 84 is if an insulating material, thus an electrical short circuit cannot occur between the gate lead 84 and the cathode lead 82.

While particular embodiments of the invention have been shown and described, it will, of course, be understood that the invention is not limited thereto since many modifications varied to fit particular operating requirements and environments will be apparent to those skilled in the art. The invention may be used to perform similar functions and its peculiar properties taken advantage of in semiconductor devices utilizing other materials than those described and such devices formed in other ways without departing from the concept of the invention. Accordingly, the invention is not considered limited to the example chosen for the purposes of disclosure.

What we claim as new and desire to secure by Letters Patent of the United States is:

1. A semiconductor rectifying device including in combination electrical contact means and a pellet of semiconductor material having two essentially parallel major faces, said pellet having its major faces connected between said electrical contact means whereby a voltage may be applied across the said major faces, said pellet having at least two regions of relatively highly doped material of unlike conductivity type separated by and contiguous with a separating region of higher resistivity than either of said two regions and of a conductivity type corresponding to that of one of said highly doped regions whereby junctures are defined between said regions which are essentially parallel to the said major faces, one of said junctures forming a rectifying junction, the surface of said body contoured in the area of said junction in such a manner that the cross-sectional area of said pellet diminishes in a direction parallel to the plane of said junctures and in a manner to form an acute angle with said planes between forty-five and seventy-five degrees with the region adjacent said junction of lowest resistivity having the largest cross-sectional area.

2. A peripherally beveled semiconductor device capable of withstanding a reverse breakdown voltage in excess of that which can be withstood by a comparable device lacking a peripheral bevel including a monocrystalline body of semiconductor material comprised of first and second regions of relatively highly doped material separated by and continguous with a third region of higher resistivity than either of said first and second regions, said first and second regions being of opposite conductivity type, said third region being of like conductivity type as said second region and forming a junction with said first region and a juncture with said second region, the surface of said body being peripherally contoured at least adjacent said junction with the cross-sectional area of said body in a direction parallel to said junction diminishing from said first region to said third region, and said contoured surface forming with said junction an angle of less than ninety degrees and in excess of twelve degrees.

3. A semiconductor device according to claim 2 in which said contoured surface forms with said junction an angle of from seventy-five degrees to forty-five degrees.

4. A semiconductor device according to claim 2 in which said contoured surface is in intimate contact with a dielectric material having a relative permitivity greater than one.

5. A semiconductor device including in combination a pair of electrical contacts, a pellet of semiconductor material having first and second major faces, said pellet having said major faces ohmically connected between said electrical contact members whereby voltage may be applied across said major faces, said pellet being comprised of first and second regions of relatively highly doped material separated by and contiguous with a third region of higher resistivity than either of said first and second regions, said first and second regions being of opposite conductivity type, said third region forming parallel junctures with said first and second regions, one of said junctures forming a rectifying junction, the periphery of said pellet being beveled adjacent said junctures with the cross-sectional area of said pellet in a direction parallel to said junctures diminishing from said first region to said third region, and said beveled periphery forming with said junction an angle of less than ninety degrees and in excess of twelve degrees.

References Cited

UNITED STATES PATENTS

| | | | |
|---|---|---|---|
| 2,962,605 | 11/1960 | Grasvalet | 307—885 |
| 2,989,424 | 6/1961 | Angello | 117—200 |
| 3,179,860 | 4/1965 | Clark et al. | 317—234 |
| 3,189,799 | 6/1965 | Maroney | 317—234 |
| 2,672,528 | 3/1954 | Shockley. | |
| 2,993,155 | 7/1961 | Gotzberger. | |
| 2,980,830 | 4/1961 | Shockley | 317—235 |
| 3,255,055 | 6/1966 | Ross. | |
| 3,260,634 | 7/1966 | Clark | 156—17 |

FOREIGN PATENTS

| | | |
|---|---|---|
| 1,243,865 | 9/1960 | France. |
| 1,273,633 | 9/1961 | France. |

JERRY D. CRAIG, Primary Examiner

U.S. Cl. X.R.

148—1.5; 317—235